United States Patent
Lee et al.

(10) Patent No.: US 9,557,460 B2
(45) Date of Patent: Jan. 31, 2017

(54) TRANSPARENT CONDUCTIVE LAYER AND CF SUBSTRATE HAVING SAME AND MANUFACTURING METHOD THEREOF

(71) Applicant: Shenzhen China Star Optoelectronics Technology Co., Ltd., Shenzhen, Guandong (CN)

(72) Inventors: Kuancheng Lee, Guangdong (CN); Yewen Wang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/829,467

(22) Filed: Aug. 18, 2015

(65) Prior Publication Data

US 2015/0355501 A1    Dec. 10, 2015

Related U.S. Application Data

(62) Division of application No. 14/111,561, filed on Oct. 13, 2013.

(51) Int. Cl.
| | | |
|---|---|---|
| G02B 5/22 | (2006.01) |
| G02B 1/10 | (2015.01) |
| G02B 5/20 | (2006.01) |
| G02F 1/1335 | (2006.01) |
| C23C 16/01 | (2006.01) |

(Continued)

(52) U.S. Cl.
CPC .............. *G02B 5/201* (2013.01); *B32B 38/10* (2013.01); *C01B 31/00* (2013.01); *C01B 31/0453* (2013.01); *C01B 31/0484* (2013.01); *C23C 16/01* (2013.01); *C23C 16/26* (2013.01); *G02B 5/226* (2013.01); *G02F 1/13439* (2013.01); *G02F 1/133514* (2013.01); *G02F 1/133516* (2013.01); *B32B 37/025* (2013.01); *B32B 2037/246* (2013.01); *B32B 2307/202* (2013.01); *B32B 2307/412* (2013.01); *B32B 2310/0418* (2013.01); *B32B 2311/12* (2013.01); *B32B 2311/22* (2013.01); *B32B 2313/04* (2013.01);

(Continued)

(58) Field of Classification Search
CPC ......... G02B 1/105; G02B 5/285; G02B 1/115; G02B 5/223; G02B 1/04; G02B 5/287; G02B 1/113; G02B 1/116; G02B 5/20; G02B 5/207; G02F 1/133514; G02F 1/133516
USPC ............... 359/885, 891, 892, 580, 582, 585, 586,359/588, 589, 590
See application file for complete search history.

(56) References Cited

U.S. PATENT DOCUMENTS

| | | | | |
|---|---|---|---|---|
| 2011/0030991 A1* | 2/2011 | Veerasamy | ............. | C30B 29/02 174/126.1 |
| 2013/0154478 A1* | 6/2013 | Ohe | ....................... | H01L 27/322 315/85 |
| 2014/0001152 A1* | 1/2014 | Zurutuza Elorza | . | C01B 31/0484 216/36 |

* cited by examiner

*Primary Examiner* — Jade R Chwasz
(74) *Attorney, Agent, or Firm* — Andrew C. Cheng

(57) ABSTRACT

A transparent conductive layer is made of a graphene transparent conductive material and is in the form of a thin film having a thickness of 0.36 nm-10 nm, transmittance of visible light being 80-97%, and surface resistance being 30-500Ω/□. A CF substrate includes the graphene transparent conductive layer to replace and ITO transparent conductive layer in order to obtain an electrode or a static electricity draining layer having high transmittance and excellent flexibility and, when used in a liquid crystal display panel, helps improve the transmittance of the liquid crystal panel and (Continued)

reduce the use of backlighting. Also provided is a manufacturing method of the CF substrate having the graphene transparent conductive layer, which uses a CVD process to form graphene on a growth substrate to be subsequently transferred to a CF substrate body.

5 Claims, 3 Drawing Sheets

(51) Int. Cl.
*G02F 1/1343* (2006.01)
*B32B 38/10* (2006.01)
*C01B 31/00* (2006.01)
*C01B 31/04* (2006.01)
*C23C 16/26* (2006.01)
*B32B 37/00* (2006.01)
*B32B 37/24* (2006.01)

(52) U.S. Cl.
CPC ........ *B32B 2551/00* (2013.01); *G02F 2202/36* (2013.01)



TRANSPARENT CONDUCTIVE LAYER AND CF SUBSTRATE HAVING SAME AND MANUFACTURING METHOD THEREOF

CROSS REFERENCE TO RELATED APPLICATIONS

This is a divisional application of co-pending patent application Ser. No. 14/111,561, filed on Oct. 13, 2013.

BACKGROUND OF THE INVENTION

1. Field of the Invention

The present invention relates to the field of liquid crystal displaying, and in particular to a graphene transparent conductive layer and a CF (Color Filter) substrate having the conductive transparent layer and a manufacturing method thereof.

2. The Related Arts

Heretofore, a commonly used transparent conductive material is a metal oxide mixed transparent conductive material, such as indium tin oxide (ITO), indium zinc oxide (IZO), and aluminum-doped zinc oxide (AZO), among which the most commonly used one is the ITO transparent conductive material that has a light transmittance as high as 90%. However, element indium is a rare and expensive metal and the manufacture of ITO film requires high degree of vacuum and a relatively high temperature. The ITO film so obtained is brittle, making it difficult to make a flexible electrode. These limit further development of the ITO transparent conductive material.

Recently, researches revealed that graphene is novel carbon based material having a two-dimensional honeycomb structure formed by a single layer of densely packed carbon atoms. Graphene is the thinnest but hardest nanometer material that is currently known and is almost perfectly clear, absorbing 2.3% of light and having an electric resistivity of around $10^{-6}\Omega\cdot$cm, which is lower than that of copper or silver, making it a material of lowest electric resistivity that is currently known, and can be manufactured by various processes, such as chemical vapor deposition (CVD), micro-machine exfoliation, and epitaxial growth. Since graphene has an electrical conductivity that matches ITO and has a light transmittance as high as 97% and also since graphene has mechanical strength and flexibility both superior to the ITO transparent conductive material, graphene can be used completely in place of ITO in making a transparent conductive electrode or conductive layer. Further, graphene made with a CVD process is of low manufacture cost, requiring no high temperature and high pressure, and the technique for transferring graphene so manufactured to a substrate to serve as a transparent electrode or a transparent conductive layer is getting mature. Compared to the ITO transparent conductive materials, graphene has a wider and more prosperous future in flexible displaying.

It is thus desired to provide a graphene transparent conductive layer having various parameters that are all suitable to replace the ITO transparent conductive layer for use in an CF substrate of a liquid crystal display in order to acquire an electrode of a graphene transparent conductive layer having high transmittance and excellent flexibility to accordingly improve the transmittance of a CF substrate of a liquid crystal display panel that uses graphene transparent conductive material and reduce the use of backlighting.

SUMMARY OF THE INVENTION

An object of the present invention is to provide a graphene transparent conductive layer, which is usable in place of the conventional metal oxide mixed transparent conductive layer and shows improved mechanical strength and flexibility.

Another object of the present invention is to provide a CF substrate having a graphene transparent conductive layer, which uses a graphene transparent conductive layer to replace an ITO transparent conductive layer used in a CF substrate of a liquid crystal display in order to acquire an electrode of a graphene transparent conductive layer or a static electricity draining layer that has high transmittance and excellent flexibility for use in a liquid crystal display panel to improve the transmittance of the liquid crystal panel and reduce the use of backlighting.

A further object of the present invention is to provide a manufacturing method of a CF substrate having a graphene transparent conductive layer, of which the operation is easy and the manufacture can be easily achieved so that the CF substrate that has the graphene transparent conductive layer has the advantages of high transmittance and excellent flexibility.

To achieve the above objects, the present invention provides a transparent conductive layer, which is made of a graphene transparent conductive material and is in the form of a thin film having a thickness of 0.36 nm-10 nm, transmittance of visible light being 80-97%, and surface resistance being 30-500Ω/□.

The present invention also provides a color filter (CF) substrate, which comprises: a CF substrate body and a transparent conductive layer formed on the CF substrate body. The transparent conductive layer is made of a graphene transparent conductive material in the form of a thin film having a thickness of 0.36 nm-10 nm, transmittance of visible light being 80-97%, and surface resistance being 30-500Ω/□.

The CF substrate body comprises a glass substrate and a color resist layer formed on the glass substrate. The color resist layer comprises a plurality of pixel units that is arranged in an array and a black matrix arranged around an outer circumference of the pixel units.

The transparent conductive layer is arranged on the color resist layer.

The transparent conductive layer and the color resist layer are respectively arranged on two opposite surfaces of the glass substrate.

The present invention further provides a manufacturing method of a CF substrate, which comprises the following steps:

(11) placing a growth substrate in a chemical vapor deposition reactor and introducing a mixed gas of a carbon source gas and a carrier gas to carry out a reaction under the conditions of 900-1120° C. and 40 Pa-5000 KPa for 1-60 min so as to grow a graphene film on the growth substrate, wherein the graphene film has a thickness of 0.36 nm-10 nm, transmittance of visible light being 80-97%, and surface resistance being 30-500Ω/□;

(12) coating a transfer medium layer on the graphene film to obtain a combination of transfer medium layer/graphene film/growth substrate;

(13) dipping the combination of transfer medium layer/graphene film/growth substrate in a growth substrate corrosive liquid to remove the growth substrate so as to obtain a combination of transfer medium layer/graphene film;

(14) providing a CF substrate body, wherein the CF substrate body comprises a glass substrate and a color resist layer formed on the glass substrate;

(15) positioning the combination of transfer medium layer/graphene film on the CF substrate body to proceed with transferring in room temperature so as to obtain a combination of transfer medium layer/graphene film/CF substrate body; and

(16) placing and washing the combination of transfer medium layer/graphene film/CF substrate body in a transfer medium layer removing solvent to remove the transfer medium layer so as to obtain a graphene film on the CF substrate body and thus forming a transparent conductive layer on the CF substrate body.

In step (15), the combination of transfer medium layer/graphene film is positioned on the color resist layer of the CF substrate body; and in step (16), the transparent conductive layer is formed on the color resist layer of the CF substrate body.

In step (15), the combination of transfer medium layer/graphene film is positioned on the glass substrate of the CF substrate body; and in step (16), the transparent conductive layer is formed on the glass substrate of the CF substrate body.

The carbon source gas is methane, ethylene, or acethylene; the carrier gas is hydrogen or a mixed gas of hydrogen and argon; the growth substrate is a metal foil made of Ni, Cu, or Ru; the growth substrate corrosive liquid is $FeCl_3$ solution or an acid solution; and the transfer medium layer is poly methyl methacrylate or poly dimethyl acrylamide.

The carbon source gas is methane; the carrier gas is hydrogen; the growth substrate is a Cu foil, the copper foil having a purity 99%; the transfer medium layer is poly methyl methacrylate; the growth substrate corrosive liquid is 0.1-1.5 mol/L $FeCl_3$ solution; and the transfer medium layer removing solvent is acetone alcohol solution.

The efficacy of the present invention is that the present invention provides a transparent conductive layer made of graphene, having electrical conductivity matching a transparent conductive layer made of ITO. The graphene-made transparent conductive layer has light transmittance of 97%. Further, the graphene-made transparent conductive layer according to the present invention has mechanical strength and flexibility both superior to the ITO-made transparent conductive layer and is more suitable for the field of flexible substrates. Further, in using a CVD process to manufacture a graphene transparent conductive layer, the operation is easy and the manufacture can be easily achieved so that the manufacture cost is made even lower. Applying the graphene transparent conductive layer to the field of liquid crystal displaying to make a CF substrate having a graphene transparent conductive layer, since the graphene transparent conductive layer that has improved light transmittance performance, mechanical strength, and flexibility is used to replace an ITO transparent conductive layer, the CF substrate having the graphene transparent conductive layer, when used in a liquid crystal display panel, may improve the transmittance of the liquid crystal panel and reduce the use of backlighting. Further, the manufacturing method of the CF substrate that has the graphene transparent conductive layer according to the present invention uses a CVD process to form a graphene film on a growth substrate to be subsequently transferred to a CF substrate body, of which the manufacture is easy and the cost is low.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
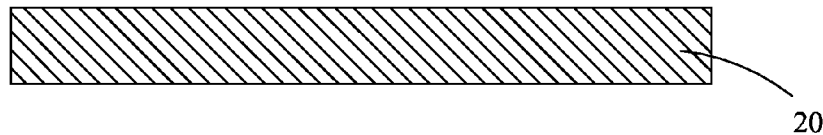
FIG. 1 is a schematic view showing the structure of a transparent conductive layer according to the present invention.
Figure 2:
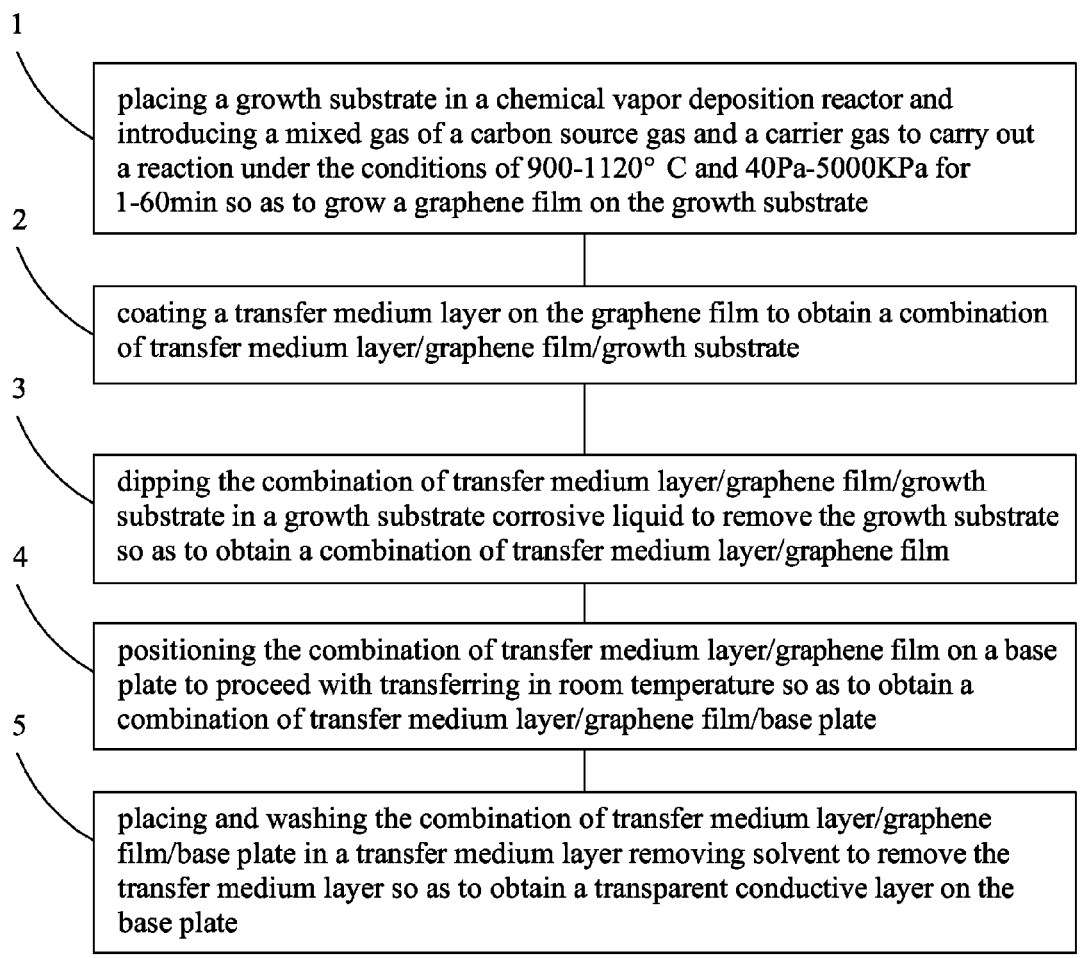
FIG. 2 is a flow chart illustrating a manufacturing method of a transparent conductive layer according to the present invention.

Referring to FIGS. 1 and 2, the present invention provides a transparent conductive layer 20, which is made of a graphene transparent conductive material and is in the form of a thin film having a thickness of 0.36 nm-10 nm, transmittance of visible light being 80-97%, and surface resistance being 30-500Ω/□. The transparent conductive layer 20 possesses excellent electric conduction performance and light transmittance performance and may completely substitute the conventional ITO-made transparent conductive layers for use in the fields of touch screens, liquid crystal displays, organic photovoltaic cells, and organic light-emitting diodes. Further, the graphene-made transparent conductive layer 20 has improved mechanical strength and flexibility and is more suitable for the field of flexible substrates.

The transparent conductive layer 20 is made by a chemical vapor deposition process, of which the operation is easy and the manufacture can be readily achieved with low cost. Specifically, referring to FIG. 2, a manufacturing method of the transparent conductive layer 20 comprises the following steps:

Step 1: placing a growth substrate in a chemical vapor deposition reactor and introducing a mixed gas of a carbon source gas and a carrier gas to carry out a reaction under the conditions of 900-1120° C. and 40 Pa-5000 KPa for 1-60 min so as to grow a graphene film on the growth substrate.

The growth substrate is made of nickel (Ni), copper (Cu), or ruthenium (Ru) and is preferably a metal foil made of Ni, Cu, or Ru. For growth substrates made of different materials, the carbon source gas and the carrier gas used are different. In the instant embodiment, the growth substrate is a Cu foil and the copper foil has a purity 99%.

The carbon source gas is generally hydrocarbons. The type of carbon source determines the growth temperature of the chemical vapor deposition process. In the process adopted here, the carbon source gas is preferably methane, ethylene, or acethylene. In the instant embodiment, the carbon source gas is methane.

The carrier gas is hydrogen or a mixed gas of hydrogen and argon. In the instant embodiment, the carrier gas is hydrogen.

The carbon source gas is decomposed by the high temperature on the surface of the growth substrate and graphene grows. For a metallic growth substrate, such as Ni, which has high carbon solubility, the carbon atoms generated through the decomposition of the carbon source penetrate into the metallic growth substrate at the high temperature and precipitates and nucleates therein when temperature drops so as to form a graphene film. For a metallic growth substrate, such as Cu, which has low carbon solubility, the carbon atoms generated through the decomposition of the gaseous carbon source at a high temperature attach to the metal surface to nucleate and grow to form "graphene islands". Through two-dimensional expansion and combination of the "graphene islands", a continuous graphene film is obtained. Manufactured with the CVD process, the graphene film so formed shows high quality and can grow over a large area.

Step 2: coating a transfer medium layer on the graphene film to obtain a combination of transfer medium layer/graphene film/growth substrate.

The transfer medium layer can be poly methyl methacrylate (PMMA) or poly dimethyl acrylamide (PDMA). In the instant embodiment, the transfer medium layer is poly methyl methacrylate.

For the graphene film that has a thickness of only several nanometers, the macro strength is low and breaking may readily result during the process of transfer. Using the transfer medium ensures an intact structure of the graphene film after the transfer without damage and causing no contamination to the graphene film.

Step 3: dipping the combination of transfer medium layer/graphene film/growth substrate in a growth substrate corrosive liquid to remove the growth substrate so as to obtain a combination of transfer medium layer/graphene film.

The growth substrate corrosive liquid will be different for different growth substrates and is often a $FeCl_3$ solution (that corrodes a Cu based growth substrate) or an acid solution (that corrodes a Ni based growth substrate). In the instant embodiment, the growth substrate corrosive liquid is 0.1-1.5 mol/L $FeCl_3$ solution, which erodes away the copper foil to achieve separation of the graphene film from the growth substrate.

Step 4: positioning the combination of transfer medium layer/graphene film on a base plate to proceed with transferring in room temperature so as to obtain a combination of transfer medium layer/graphene film/base plate.

The base plate can be a CF substrate body, a glass substrate, or a plastic substrate to which a conductive electrode or a conductive layer is to be installed and can be selected to suit the needs.

Step 5: placing and washing the combination of transfer medium layer/graphene film/base plate in a transfer medium layer removing solvent to remove the transfer medium layer so as to obtain a transparent conductive layer 20 on the base plate.

The transfer medium layer removing solvent is a solvent that removes the transfer medium layer but does not damage and contamination the graphene film and can be selected according to the properties of graphene and the material of the transfer medium layer itself. Since acetone alcohol solution can effectively remove poly methyl methacrylate and does not damage and contaminate the graphene film, in the instant embodiment, the transfer medium layer removing solvent is acetone alcohol solution.

Figure 3:
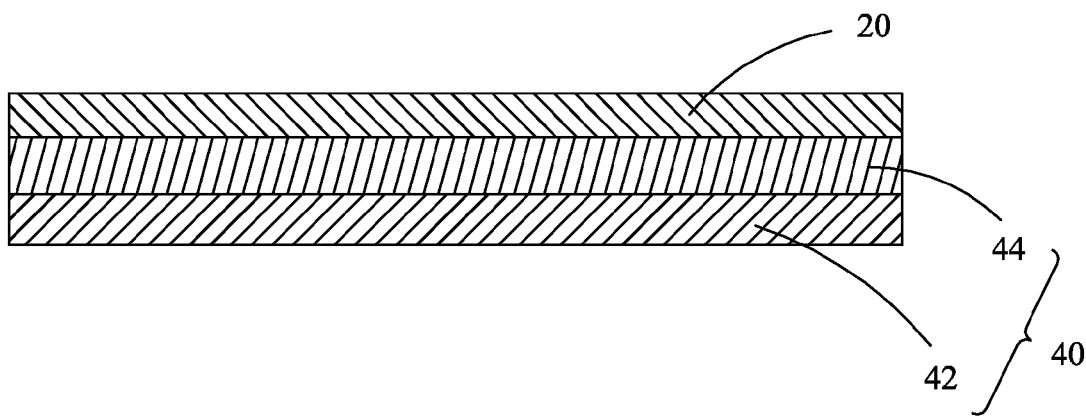
FIG. 3 is a schematic view showing the structure of a CF substrate according to a first preferred embodiment of the present invention.

Referring to FIG. 3, the transparent conductive layer 20 is applied to a CF substrate of a liquid crystal display panel to serve as an electrode and a CF substrate that uses a graphene transparent conductive material according to a first preferred embodiment of the present invention is obtained, which comprises, specifically: a CF substrate body 40 and a transparent conductive layer 20 formed on the CF substrate body 40. The transparent conductive layer 20 is made of a graphene transparent conductive material and is in the form of a thin film having a thickness of 0.36 nm-10 nm, transmittance of visible light being 80-97%, and surface resistance being 30-500Ω/□.

The CF substrate body 40 comprises a glass substrate 42 and a color resist layer 44 formed on the glass substrate 42. The glass substrate 42 is a high purity alkali free glass. The color resist layer 44 comprises a plurality of pixel units that is arranged in an array and a black matrix arranged around an outer circumference of the pixel units.

In the instant embodiment, the transparent conductive layer 20 is formed on the color resist layer 44 to serve as a common electrode of a liquid crystal display panel to induce, together with a pixel electrode (not shown) on a TFT (Thin-Film Transistor) substrate (not shown), an electric field for driving liquid crystal molecules to rotate. In this condition, the CF substrate is often a CF substrate for a high definition display mode but is not limited thereto, for it is possible to provide a CF substrate for other display modes that require installation of a transparent conductive electrode.

Figure 4:
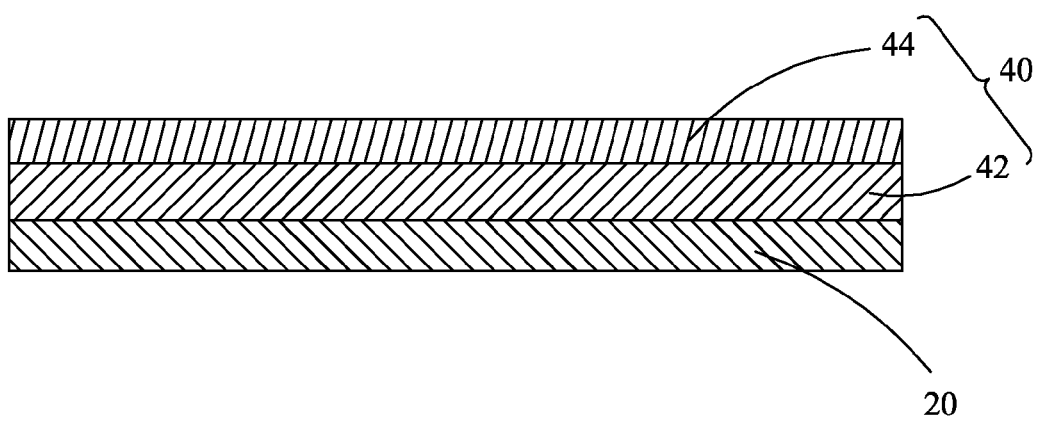
FIG. 4 is a schematic view showing the structure of a CF substrate according to a second preferred embodiment of the present invention.

Referring to FIG. 4, which is a schematic view showing the structure of a CF substrate according to a second preferred embodiment of the present invention, in the instant embodiment, the transparent conductive layer 20 and the color resist layer 44 are respectively formed on opposite surfaces of the glass substrate 42. The transparent conductive layer 20 serves as a static electricity draining layer for draining static electricity from a liquid crystal display panel to extend the life span of the liquid crystal display panel. Further, using an ITO layer to serve as a static electricity draining layer requires to attach a layer of protection film on a surface of ITO to protect the ITO static electricity draining layer, while in the present invention, the static electricity draining layer is made of a graphene transparent conductive layer 20, which requires no protection layer so as to reduce the manufacture cost.

When the transparent conductive layer 20 works as a static electricity draining layer, the CF substrate is generally a CF substrate used in an IPS (In-Plane Switching) display mode or a CF substrate used in an FFS (Fringe Field Switching) display mode, but is not limited to serving as the CF substrates of these two display modes and can be a CF substrate for other display modes that requires a static electricity draining layer.

Figure 5:
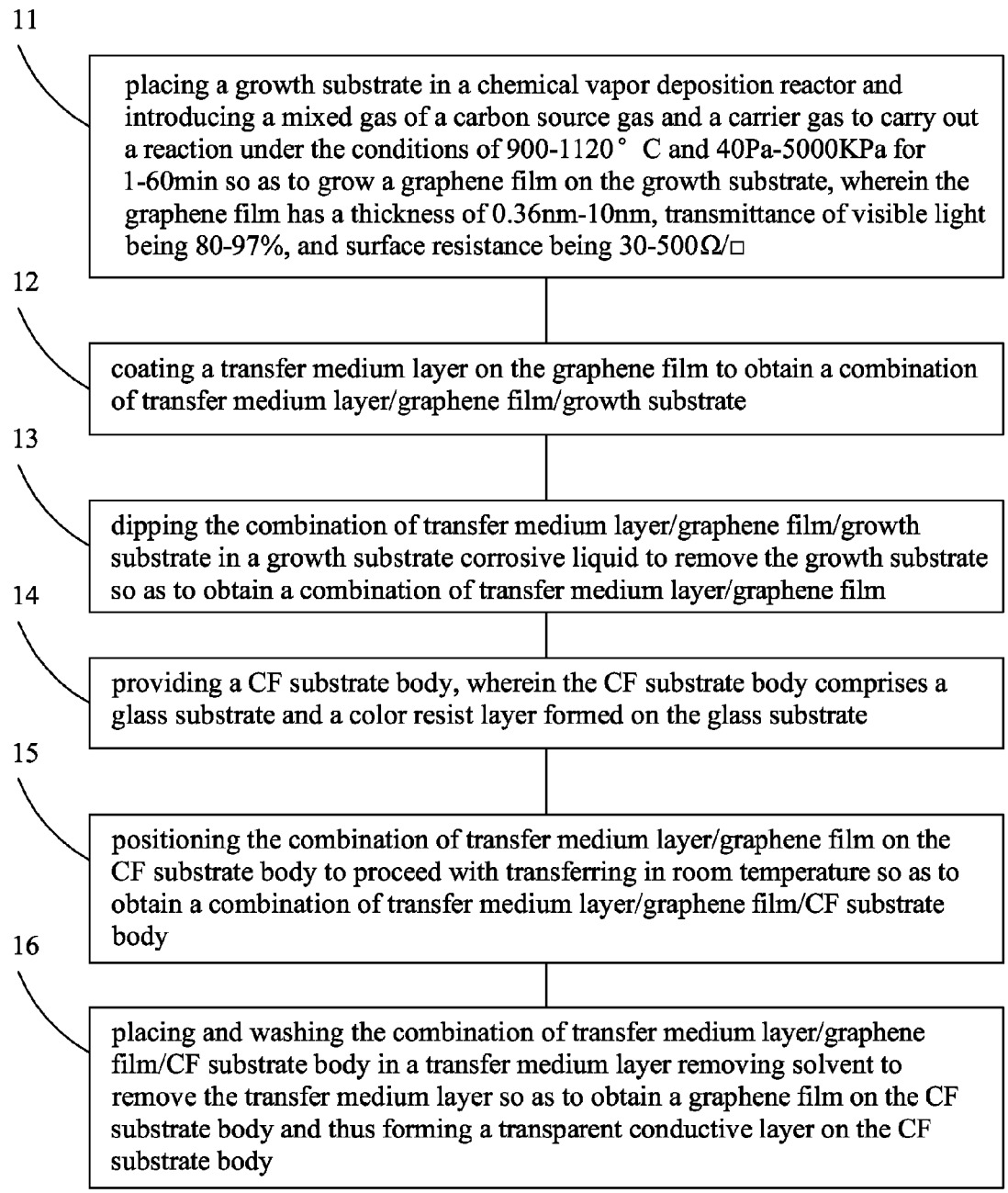
FIG. 5 is a flow chart illustrating a manufacturing method of a CF substrate according to the present invention.

Referring to FIG. 5, the present invention further provides a manufacturing method of a CF substrate, which comprises the following steps:

Step 11: placing a growth substrate in a chemical vapor deposition reactor and introducing a mixed gas of a carbon source gas and a carrier gas to carry out a reaction under the conditions of 900-1120° C. and 40 Pa-5000 KPa for 1-60 min so as to grow a graphene film on the growth substrate, wherein the graphene film has a thickness of 0.36 nm-10 nm, transmittance of visible light being 80-97%, and surface resistance being 30-500Ω/□.

The growth substrate is made of nickel (Ni), copper (Cu), or ruthenium (Ru) and is preferably a metal foil made of Ni, Cu, or Ru. For growth substrates made of different materials, the carbon source gas and the carrier gas used are different. In the instant embodiment, the growth substrate is a Cu foil and the copper foil has a purity ≥99%.

The carbon source gas is generally hydrocarbons. The type of carbon source determines the growth temperature of the chemical vapor deposition process. In the process adopted here, the carbon source gas is preferably methane, ethylene, or acethylene. In the instant embodiment, the carbon source gas is methane.

The carrier gas is hydrogen or a mixed gas of hydrogen and argon. In the instant embodiment, the carrier gas is hydrogen.

The carbon source gas is decomposed by the high temperature on the surface of the growth substrate and graphene grows. For a metallic growth substrate, such as Ni, which has high carbon solubility, the carbon atoms generated through the decomposition of the carbon source penetrate into the metallic growth substrate at the high temperature and precipitates and nucleates therein when temperature drops so as to form a graphene film. For a metallic growth substrate, such as Cu, which has low carbon solubility, the carbon atoms generated through the decomposition of the gaseous carbon source at a high temperature attach to the metal surface to nucleate and grow to form "graphene islands". Through two-dimensional expansion and combination of the "graphene islands", a continuous graphene film is obtained. Manufactured with the CVD process, the graphene film so formed shows high quality and can grow over a large area.

Step 12: coating a transfer medium layer on the graphene film to obtain a combination of transfer medium layer/graphene film/growth substrate.

The transfer medium layer can be poly methyl methacrylate or poly dimethyl acrylamide. In the instant embodiment, the transfer medium layer is poly methyl methacrylate.

For the graphene film that has a thickness of only several nanometers, the macro strength is low and breaking may readily result during the process of transfer. Using the transfer medium ensures an intact structure of the graphene film after the transfer without damage and causing no contamination to the graphene film.

Step 13: dipping the combination of transfer medium layer/graphene film/growth substrate in a growth substrate corrosive liquid to remove the growth substrate so as to obtain a combination of transfer medium layer/graphene film.

The growth substrate corrosive liquid will be different for different growth substrates and is often a $FeCl_3$ solution (that corrodes a Cu based growth substrate) or an acid solution (that corrodes a Ni based growth substrate). In the instant embodiment, the growth substrate corrosive liquid is 0.1-1.5 mol/L $FeCl_3$ solution, which erodes away the copper foil to achieve separation of the graphene film from the growth substrate.

Step 14: providing a CF substrate body 40, wherein the CF substrate body 40 comprises a glass substrate 42 and a color resist layer 44 formed on the glass substrate 42.

Specifically, the color resist layer 44 is formed on a surface of the glass substrate through a yellow light process of rinsing, coating, pre-baking, exposure, development, and post-baking. The color resist layer 44 comprises a plurality of pixel units that is arranged in an array and a black matrix arranged around an outer circumference of the pixel units.

Step 15: positioning the combination of transfer medium layer/graphene film on the CF substrate body 40 to proceed with transferring in room temperature so as to obtain a combination of transfer medium layer/graphene film/CF substrate body.

Specifically, according to specific requirements for the CF substrate body 42 (depending on the display mode with which the CF substrate is used), the combination of transfer medium layer/graphene film can be positioned on the color resist layer 44 of the CF substrate body 40 (as shown in FIG. 3) to serve as a common electrode of a liquid crystal display panel; alternatively, the combination of transfer medium layer/graphene film can be positioned on the glass substrate 42 of the CF substrate body 40 (as shown in FIG. 4) to serve as a static electricity draining layer.

Step 16: placing and washing the combination of transfer medium layer/graphene film/CF substrate body in a transfer medium layer removing solvent to remove the transfer medium layer so as to obtain a graphene film on the CF substrate body 40 and thus forming a transparent conductive layer 20 on the CF substrate body 40.

The transfer medium layer removing solvent is a solvent that removes the transfer medium layer but does not damage and contaminate the graphene film and can be selected according to the properties of graphene and the material of the transfer medium layer itself. Since acetone alcohol solution can effectively remove poly methyl methacrylate and does not damage and contaminate the graphene film, in the instant embodiment, the transfer medium layer removing solvent is acetone alcohol solution.

Specifically, according to the specific operation of Step 15, the transparent conductive layer 20 formed on the color resist layer 44 can serve as a common electrode of a liquid crystal display panel to induce, together with a pixel electrode (not shown) on a TFT substrate (not shown), an electric field for driving liquid crystal molecules to rotate. In this condition, the CF substrate is often a CF substrate for a high definition display mode but is not limited thereto, for it is possible to provide a CF substrate for other display modes that require installation of a transparent conductive electrode.

If the transparent conductive layer 20 and the color resist layer 44 are respectively formed on opposite surfaces of the glass substrate 42, the transparent conductive layer 20 serves as a static electricity draining layer for draining static electricity from a liquid crystal display panel to extend the life span of the liquid crystal display panel. Further, using an ITO layer to serve as a static electricity draining layer requires to attach a layer of protection film on a surface of ITO to protect the ITO static electricity draining layer, while in the present invention, the static electricity draining layer is made of a graphene transparent conductive layer 20, which requires no protection layer so as to reduce the manufacture cost. When the transparent conductive layer 20 works as a static electricity draining layer, the CF substrate is generally a CF substrate used in an IPS (In-Plane Switching) display mode or a CF substrate used in an FFS (Fringe Field Switching) display mode, but is not limited to serving as the CF substrates of these two display modes and can be a CF substrate for other display modes that requires a static electricity draining layer.

In summary, the present invention provides a transparent conductive layer made of graphene, having electrical conductivity matching a transparent conductive layer made of ITO. The graphene-made transparent conductive layer has light transmittance of 97%. Further, the graphene-made transparent conductive layer according to the present invention has mechanical strength and flexibility both superior to the ITO-made transparent conductive layer and is more suitable for the field of flexible substrates. Further, in using a CVD process to manufacture a graphene transparent conductive layer, the operation is easy and the manufacture can be easily achieved so that the manufacture cost is made even lower. Applying the graphene transparent conductive layer to the field of liquid crystal displaying to make a CF substrate having a graphene transparent conductive layer, since the graphene transparent conductive layer that has improved light transmittance performance, mechanical strength, and flexibility is used to replace an ITO transparent conductive layer, the CF substrate having the graphene transparent conductive layer, when used in a liquid crystal display panel, may improve the transmittance of the liquid crystal panel and reduce the use of backlighting. Further, the manufacturing method of the CF substrate that has the graphene transparent conductive layer according to the present invention uses a CVD process to form a graphene film on a growth substrate to be subsequently transferred to a CF substrate body, of which the manufacture is easy and the cost is low.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A manufacturing method of a color filter (CF) substrate, comprising the following steps:
    (11) placing a growth substrate in a chemical vapor deposition reactor and introducing a mixed gas of a carbon source gas and a carrier gas to carry out a reaction under the conditions of 900-1120° C. and 110-5000 KPa for 1-60 min so as to grow a graphene film on a single side of the growth substrate, wherein the graphene film has a thickness that is greater than 0.8 nm and less than or equal to 10 nm, transmittance of visible light being 80-97%, and surface resistance being 30-500Ω/□;
    (12) coating a transfer medium layer on the graphene film to obtain a combination of transfer medium layer/graphene film/growth substrate;
    (13) dipping the combination of transfer medium layer/graphene film/growth substrate in a growth substrate corrosive liquid to remove the growth substrate so as to obtain a combination of transfer medium layer/graphene film;
    (14) providing a CF substrate body, wherein the CF substrate body comprises a glass substrate and a color resist layer formed on the glass substrate, wherein the color resist layer comprises a photoresist that changes property from being insoluble to a photoresist developer to being soluble to the photoresist developer, or from being soluble to a photoresist developer to being insoluble to the photoresist developer, upon exposure to light;
    (15) positioning the combination of transfer medium layer/graphene film on the CF substrate body to proceed with transferring in room temperature so as to obtain a combination of transfer medium layer/graphene film/CF substrate body; and
    (16) placing and washing the combination of transfer medium layer/graphene film/CF substrate body in a transfer medium layer removing solvent to remove the transfer medium layer so as to obtain a graphene film on the CF substrate body and thus forming a transparent conductive layer on the CF substrate body.

2. The manufacturing method of a CF substrate as claimed in claim 1, wherein in step (15), the combination of transfer medium layer/graphene film is positioned on the color resist layer of the CF substrate body; and in step (16), the transparent conductive layer is formed on the color resist layer of the CF substrate body.

3. The manufacturing method of a CF substrate as claimed in claim 1, wherein in step (15), the combination of transfer medium layer/graphene film is positioned on the glass substrate of the CF substrate body; and in step (16), the transparent conductive layer is formed on the glass substrate of the CF substrate body.

4. The manufacturing method of a CF substrate as claimed in claim 1, wherein the carbon source gas is methane, ethylene, or acethylene; the carrier gas is hydrogen or a mixed gas of hydrogen and argon; the growth substrate is a metal foil made of Ni, Cu, or Ru; the growth substrate corrosive liquid is $FeCl_3$ solution or an acid solution; and the transfer medium layer is poly methyl methacrylate or poly dimethyl acrylamide.

5. The manufacturing method of a CF substrate as claimed in claim 4, wherein the carbon source gas is methane; the carrier gas is hydrogen; the growth substrate is a Cu foil, the copper foil having a purity ≥99%; the transfer medium layer is poly methyl methacrylate; the growth substrate corrosive liquid is 0.1-1.5 mol/L $FeCl_3$ solution; and the transfer medium layer removing solvent is acetone alcohol solution.

* * * * *